United States Patent
Zenke

(10) Patent No.: US 6,258,690 B1
(45) Date of Patent: *Jul. 10, 2001

(54) METHOD OF MANUFACTURING SEMICONDUCTOR DEVICE

(75) Inventor: Masanobu Zenke, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/826,224

(22) Filed: Mar. 27, 1997

(30) Foreign Application Priority Data

Mar. 29, 1996 (JP) .................................................. 8-076088

(51) Int. Cl.[7] ........................... H01L 21/20; H01L 21/31; H01L 21/8242
(52) U.S. Cl. .......................... 438/396; 438/253; 438/769; 438/775; 438/791; 438/908
(58) Field of Search .................................. 438/253, 396, 438/763, 769, 775, 791, 907, 908

(56) References Cited

U.S. PATENT DOCUMENTS

| | | | |
|---|---|---|---|
| 4,990,463 | 2/1991 | Mori | ....................................... 437/52 |
| 5,349,494 | * 9/1994 | Ando . | |
| 5,397,748 | * 3/1995 | Watanabe et al. . | |
| 5,445,999 | * 8/1995 | Thakur et al. . | |
| 5,492,854 | * 2/1996 | Ando . | |
| 5,510,146 | * 4/1996 | Miyasaka . | |
| 5,578,520 | * 11/1996 | Zhang et al. . | |
| 5,663,087 | * 9/1997 | Yokozawa . | |
| 5,731,235 | * 3/1998 | Srinivasan et al. . | |

FOREIGN PATENT DOCUMENTS

| | | |
|---|---|---|
| 2-16763 | 1/1990 | (JP) . |
| 5-190769 | 7/1993 | (JP) . |

OTHER PUBLICATIONS

Ohnishi et al., "Ultrathin Oxide/Nitride/Oxide/Nitride Multilayer Films for Mbit DRAM Capacitors", Extended Abstracts of the 1992 International Conference on Solid State Devices and Materials, pp. 67–69.*

* cited by examiner

Primary Examiner—Michael Trinh
Assistant Examiner—Toniae M. Thomas
(74) Attorney, Agent, or Firm—Foley & Lardner

(57) ABSTRACT

In a method of manufacturing a semiconductor device having a capacitor portion consisting of a lower electrode, a dielectric film, and an upper electrode on a semiconductor substrate, a silicon film is formed on a surface of the lower electrode and a surface of an insulating film adjacent to the lower electrode. Annealing is preformed in an atmosphere containing nitrogen or ammonia to nitride the silicon film. A silicon nitride film is formed by LP-CVD.

15 Claims, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device having a capacitor portion.

2. Description of the Prior Art

For semiconductor devices such as DRAMs, integration of a semiconductor device having a capacitor as a constituent element is progressing year by year.

For high integration, the wiring and circuit elements must be micropatterned. However, when the stored charge amount corresponding to a signal is reduced by micropatterning, an erroneous operation (software error) of the memory is caused by, e.g., radioactive rays such as α-rays. To solve this problem, a technique of reducing the thickness of the dielectric film of the capacitor to increase the capacitance value of the memory is used.

In a semiconductor device manufacturing method disclosed in Japanese Unexamined Patent Publication No. 2-16763 (to be referred to as prior art 1 reference hereinafter), the polysilicon film surface of a lower electrode is nitrided to convert a spontaneous oxide film on the surface into a silicon nitride film. The silicon nitride film is grown by low-pressure chemical vapor deposition (to be referred to as LP-CVD hereinafter). With this technique, the growth of the spontaneous oxide film on the polysilicon film surface can be suppressed when the wafer is fed into the LP-CVD furnace, and a high capacitance value can be obtained.

FIGS. 1A to 1E are sectional views showing steps in manufacturing the semiconductor device of the prior art 1 reference. As shown in FIG. 1A, a silicon oxide film 2 is formed on a silicon substrate 1, and a polysilicon film 9 as a lower electrode is deposited on the resultant structure. The polysilicon film is doped with an impurity such as phosphorus by ion implantation or diffusion. When the resultant structure is left to stand at room temperature, a spontaneous oxide film 10 is formed on the surface of the polysilicon film 9, as shown in FIG. 1B.

As shown in FIG. 1C, the spontaneous oxide film 10 formed on the surface of the polysilicon film 9 is converted into a silicon nitride film 11 by rapid thermal nitridation (to be referred to as RTN hereinafter).

As shown in FIG. 1D, a silicon nitride film 12 is deposited on the silicon nitride film 11 by LP-CVD. The surface of the silicon nitride film 12 is oxidized to form a silicon oxide film 13. The dielectric film of a capacitor is constituted by the silicon nitride film 11, the silicon nitride film 12, and the silicon oxide film 13. As shown in FIG. 1E, a polysilicon film 14 as an upper electrode is formed on the silicon oxide film 13.

In a semiconductor device manufacturing method disclosed in Japanese Unexamined Patent Publication No. 5-190769 (to be referred to as prior art 2 reference hereinafter), an amorphous silicon film is formed on a polysilicon film as a lower electrode. After nitrogen atoms are ion-implanted, the amorphous silicon film is nitrided by RTN to form a silicon nitride film. With this technique, a high-quality thin dielectric film is realized.

FIGS. 2A to 2E are sectional views showing steps in manufacturing the semiconductor device of the prior art 2 reference. As shown in FIG. 2A, a silicon oxide film 2 is formed on a silicon substrate 1, and a polysilicon film is deposited on the resultant structure. The polysilicon film is doped with an impurity such as phosphorus by ion implantation or diffusion and patterned into the shape of a lower electrode 3. As shown in FIG. 2B, an amorphous silicon film 4 is formed on the surface of the polysilicon film by LP-CVD.

As shown in FIG. 2C, nitrogen atoms are implanted into the amorphous silicon film. As shown in FIG. 2D, the amorphous silicon film is nitrided by RTN and then oxidized to form a nitrooxide film 15 on the silicon nitride film. As shown in FIG. 2E, a polysilicon film is formed on the nitrooxide film 15 as a dielectric film. An impurity such as phosphorus is diffused, and the polysilicon film is patterned into the shape of an upper electrode 8.

The above-described prior arts have the following problems.

In the prior art 1 reference, the silicon nitride film is formed on the polysilicon film as a lower electrode by RTN. However, no perfect silicon nitride film is formed on a silicon-oxide-based insulating film, i.e., the interlayer adjacent to the lower electrode.

In FIGS. 1A to 1E, when the silicon nitride film 12 is to be formed by LP-CVD, the growth rate at the first stage of formation changes on the silicon nitride film 11 formed on the surface of the lower electrode 9 by RTN and on the silicon-oxide-based insulating film adjacent to the lower electrode. Since the thickness of the silicon nitride film 12 on the surface of the lower electrode is made different from that on the insulating interlayer, a leakage current easily flows.

FIG. 3 shows the relationship between the growth time and growth thickness of the silicon nitride film on the silicon nitride film and on the silicon-oxide-based insulating film. The growth is delayed on the interlayer, so a thickness difference of about 2.5 nm is generated for the same growth time.

As a result, the thickness of the silicon nitride film on the lower electrode 3 is made different from that on the silicon oxide film 2 as an interlayer, as shown in FIG. 4, resulting in a breakdown failure or leakage current.

More specifically, in FIG. 4, the lower electrode 3 is formed of the polysilicon film 9 shown in FIGS. 1A to 1E, and the upper electrode 8 is formed of the polysilicon film 14 shown in FIG. 1E. The surface of the silicon oxide film 2 serving as an interlayer or field insulating film is adjacent to the patterned lower electrode 3. A dielectric film 16 in FIG. 4, i.e., the capacitive insulating film 16 of a capacitor is constituted by the silicon nitride film 11, the silicon nitride film 12, and the silicon oxide film 13 shown in FIGS. 1D and 1E. The most portion of this dielectric film 16 is constituted by the silicon nitride film 12 formed by CVD. That is, the thickness of the dielectric film 16 is dominantly determined on the basis of the thickness of the silicon nitride film 12.

The spontaneous oxide film 10 formed on the surface of the lower electrode, i.e., the polysilicon film 9 can be converted into the silicon nitride film 11 by the process of RTN shown in FIG. 1C because the spontaneous oxide film 10 is very thin. However, no silicon nitride film is formed on the silicon oxide film 2 having the necessary thickness of an interlayer or field insulating film. More specifically, although the surface of the silicon oxide film 2 is nitrided, the resultant film contains much oxygen and therefore has a strong attribute as silicon oxide.

When the silicon nitride film 12 is to be formed by LP-CVD in the process shown in FIG. 1C, the growth thickness changes, as shown in FIG. 3. As shown in FIG. 4, the dielectric film 16 formed on the surface (upper and side surfaces) of the lower electrode 3 becomes thick, and the dielectric film 16 formed on the silicon oxide film 2 becomes thin. For this reason, a constricted portion is formed in the silicon nitride film 12 at the lower end portion of the lower electrode 3, i.e., a constricted portion 17 is formed in the dielectric film 16.

In this state, a leakage current easily flows between the upper electrode 8 and the lower electrode 3 through this constricted portion 17, and a breakdown failure easily occurs at this portion.

This problem arises for a capacitor for which the dielectric film 16 must be made thin, i.e., the silicon nitride film 12 must be made thin. If the design allows a thick silicon nitride film 12, a sufficient thickness free from the problem of voltage in use can be ensured at any portion even when the thickness changes due to the delay in chemical vapor deposition.

To prevent the breakdown failure or leakage current, the silicon nitride film must be thick. The thickness of the silicon nitride film cannot be 7 nm or less. The thickness of the dielectric film cannot be 5 nm or less as a thickness converted into the silicon oxide film. Therefore, a capacitor having a large capacitance value can hardly be obtained.

In the prior art 2 reference, the dielectric film is constituted only by the silicon nitride film which is formed by implanting nitrogen atoms into the amorphous silicon film and performing RTN. The dielectric film can hardly serve as a perfect insulating film. For this reason, the upper electrode and the lower electrode are easily short-circuited, and a high-quality dielectric film can hardly be formed.

Even when the silicon nitride film is made thick by increasing the thickness of the amorphous silicon film to improve the insulating properties, only a dielectric film having imperfect insulating properties is formed because the thick amorphous silicon film is not easily nitrided. Therefore, a leakage current easily flows between the upper and lower electrodes.

As described above, in the prior arts, the dielectric film serving as a capacitive insulating film cannot be made thin and therefore cannot cope with micropatterning of the device.

SUMMARY OF THE INVENTION

The present invention has been made in consideration of the above situation of the prior arts, and has as its object to provide a method of manufacturing a semiconductor device which obtains a thin dielectric film by preventing disadvantages including a breakdown failure, thereby reliably obtaining a micropatterned device having a capacitor with a large capacitance value.

In order to achieve the above object, according to the first aspect of the present invention, there is provided a method of manufacturing a semiconductor device having a capacitor portion consisting of a lower electrode, a dielectric film, and an upper electrode on a semiconductor substrate, comprising the steps of forming a silicon film on a surface of the lower electrode and a surface of an insulating film adjacent to the lower electrode performing annealing in an atmosphere containing nitrogen or ammonia to nitride the silicon film, and forming a silicon nitride film by LP-CVD. In the first aspect, the step of forming the silicon film, the step of nitriding the silicon film, and the step of forming the silicon nitride film by LP-CVD are performed in one manufacturing apparatus, e.g., a vertical LP-CVD apparatus or a multi-chamber apparatus of a single wafer processing type, without exposing a wafer to an outer atmosphere. The silicon film can be formed using one of silane gas, disilane gas, and dichlorosilane gas.

According to the second aspect of the present invention, there is provided a method of manufacturing a semiconductor device having a capacitor portion consisting of a lower electrode, a dielectric film, and an upper electrode on a semiconductor substrate, comprising the steps of adsorbing gas molecules containing silicon in a surface of the lower electrode and a surface of an insulating film adjacent to the lower electrode, performing annealing in an atmosphere containing nitrogen or ammonia to nitride the adsorbed gas molecules containing silicon, and forming a silicon nitride film by an epitaxial growth. In the second aspect as well, the gas containing silicon is one of silane gas, disilane gas, and dichlorosilane gas. Preferably, the step of adsorbing the gas molecules containing silicon, the step of nitriding the adsorbed gas molecules, and the step of forming the silicon nitride film by LP-CVD are performed in one manufacturing apparatus, e.g., a vertical LP-CVD apparatus or a multi-chamber apparatus of a single wafer processing type, without exposing a wafer to an outer atmosphere.

According to the present invention having the above aspects, by forming the silicon film on the surfaces of the lower electrode and insulating film, performing annealing in the atmosphere containing nitrogen or ammonia to nitride the silicon film, and forming the silicon nitride film by CVD, capacitive insulating films having the same thickness can be formed on the lower electrode and on the silicon oxide film as an interlayer. With this structure, satisfactory breakdown voltage distribution and leakage current characteristic can be obtained, and the capacitive insulating film can be made as thin as 4 nm as a thickness converted into the silicon oxide film.

Since the silicon film is nitrided into a silicon nitride film, and the silicon nitride film is deposited on the resultant structure, the silicon film can be thin. Therefore, the silicon film can be perfectly converted into a silicon nitride film. With this structure, no short circuit occurs between the upper and lower electrodes, unlike prior art 2, and the dielectric film can be made thin.

In addition, when the process of forming the silicon film on the surfaces of the lower electrode and insulating film, the process of performing annealing in the atmosphere containing nitrogen or ammonia to nitride the silicon film, and the process of forming the silicon nitride film by LP-CVD are performed in one apparatus, the capacitive insulating film can be stably formed without being affected by adsorption in the outer atmosphere.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Several preferred embodiments of the present invention will be described below with reference to the accompanying drawings.

FIGS. 5A to 5E are schematic sectional views showing a semiconductor device in correspondence with steps of a manufacturing method according to the first embodiment of the present invention.

The processes of the first embodiment of the present invention will be described first with reference to FIGS. 5A to 5E.

Figure 5A:
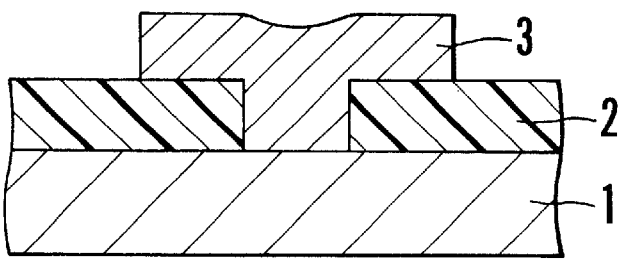
FIGS. 5A to 5E are sectional views showing steps of a manufacturing method according to the first embodiment of the present invention.

As shown in FIG. 5A, a silicon oxide film 2 is formed on a silicon substrate 1, and a contact hole is formed in the silicon oxide film 2 by conventional photolithography and dry etching. A polysilicon film having a thickness of 200 to 800 nm is formed by LP-CVD using $SiH_4$ gas. The polysilicon film is doped with an impurity such as phosphorus by ion implantation or thermal diffusion. The polysilicon film is patterned into the shape of a lower electrode 3 by conventional photolithography and dry etching.

Figure 5B:
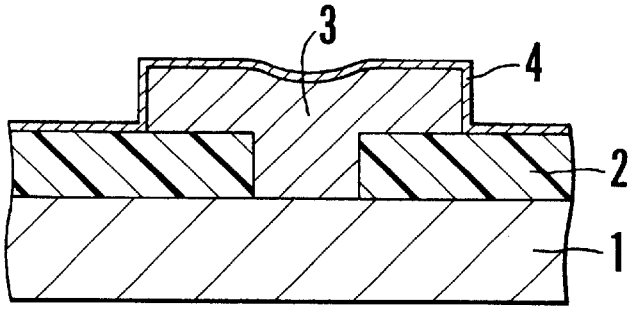

As shown in FIG. 5B, an amorphous silicon film 4 having a thickness of 0.5 to 2 nm is formed on the entire surface using $SiH_2Cl_2$ gas. The conditions for forming the amorphous silicon film 4 are as follows: the flow rate of $SiH_2Sl_3$ gas is 100 sccm, the pressure is 0.2 to 1 Torr, and the growth temperature is 500° C. to 700° C.

Figure 5C:
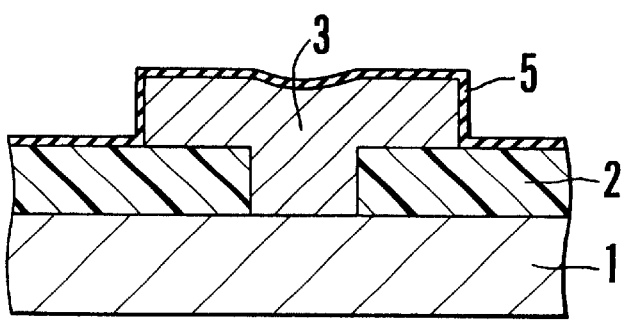

As shown in FIG. 5C, annealing is performed in an $NH_3$ gas or $N_2$ gas atmosphere at 500° C. to 900° C. to nitride the amorphous silicon film 4, thereby forming a silicon nitride film 5.

Figure 5D:
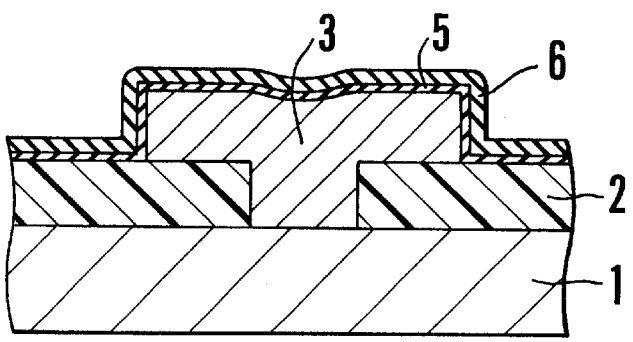

As shown in FIG. 5D, a silicon nitride film 6 having a thickness of 5 to 10 nm is formed by conventional LP-CVD using $SiH_2Cl_2$ gas or $NH_3$ gas. Subsequently, the silicon nitride film is annealed in an oxidation atmosphere to form a silicon oxide film 7 on the surface of the silicon nitride film 6, thereby forming the dielectric film of a capacitive insulating film consisting of the silicon nitride film 5, the silicon nitride film 6, and the silicon oxide film 7.

Figure 5E:
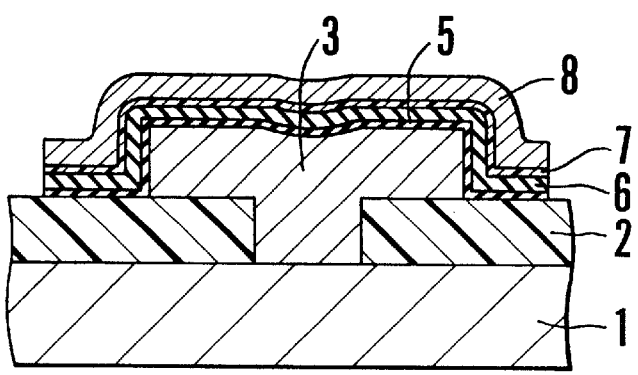

As shown in FIG. 5E, a polysilicon film having a thickness of 100 to 300 nm is formed by conventional LP-CVD. The polysilicon film is doped with an impurity such as phosphorus by ion implantation or thermal diffusion and patterned into the shape of an upper electrode 8 by conventional photolithography and dry etching.

Figure 1A:
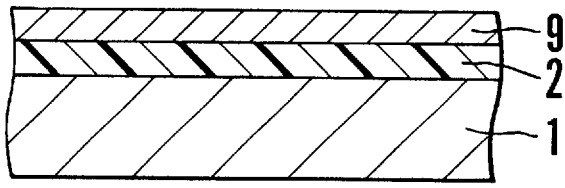
FIGS. 1A to 1E are sectional views showing manufacturing steps of prior art 1.
Figure 1B:
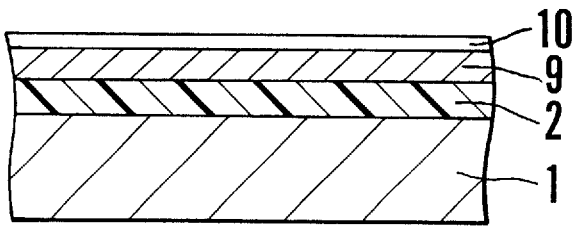
Figure 1C:
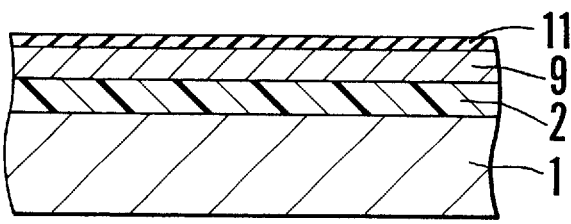
Figure 1D:
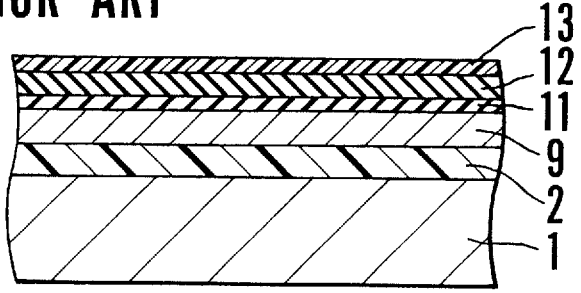
Figure 1E:
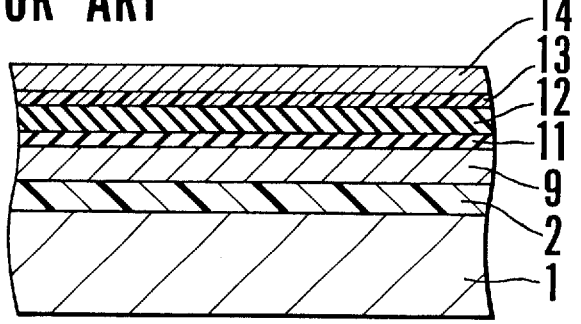
Figure 2A:
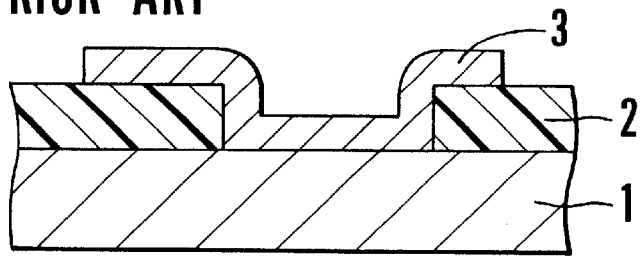
FIGS. 2A to 2E are sectional views showing manufacturing steps of prior art 2.
Figure 2B:
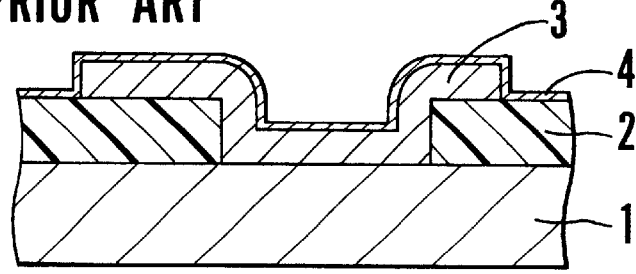
Figure 2C:
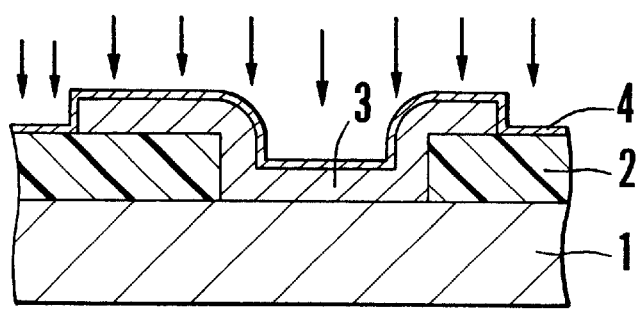
Figure 2D:
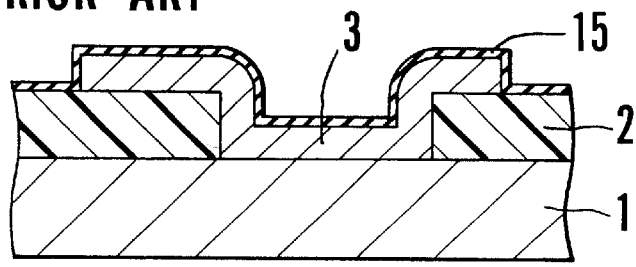
Figure 2E:
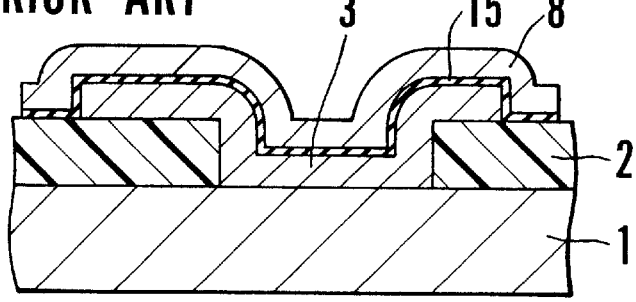
Figure 3:
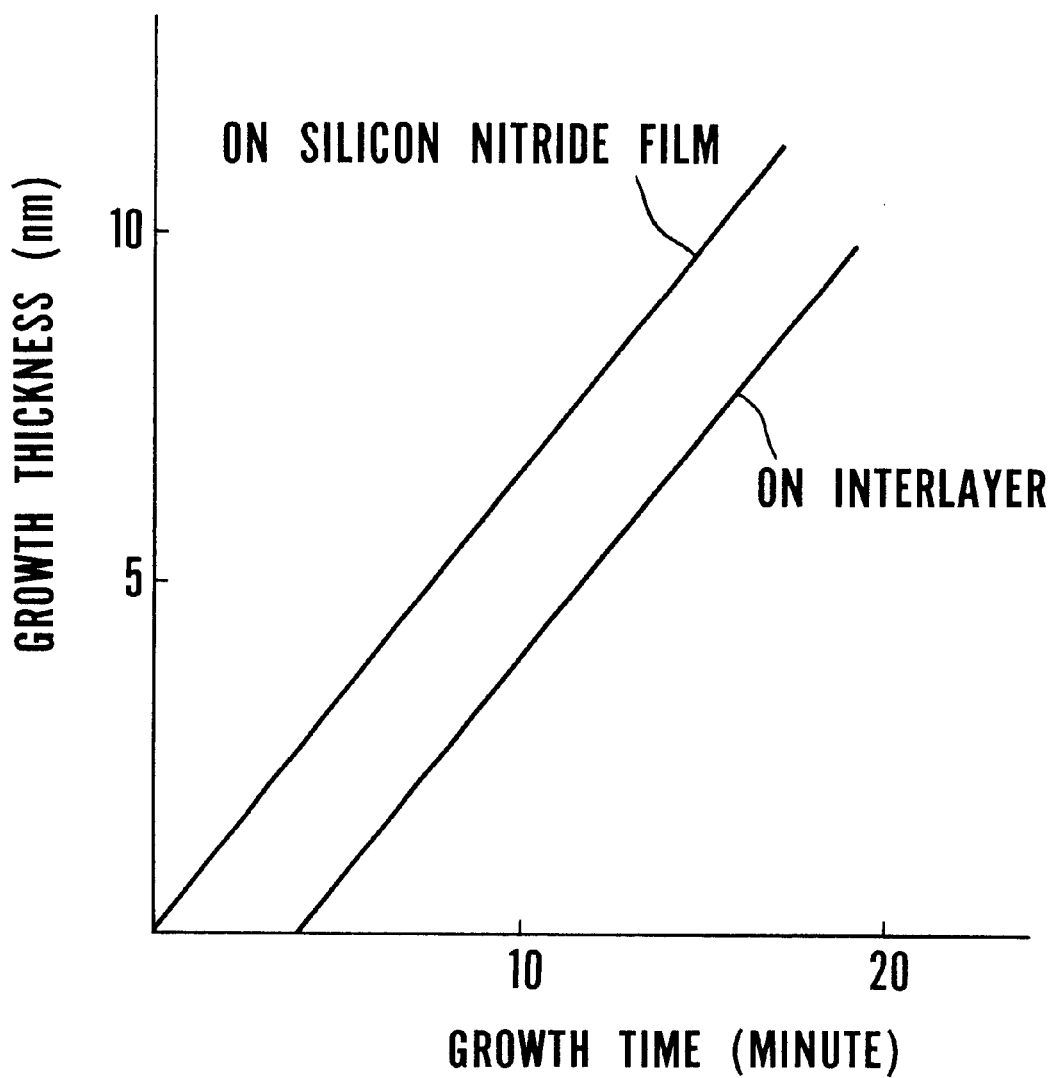
FIG. 3 is a graph showing the relationship between the growth time and growth thickness of a silicon nitride film.
Figure 4:
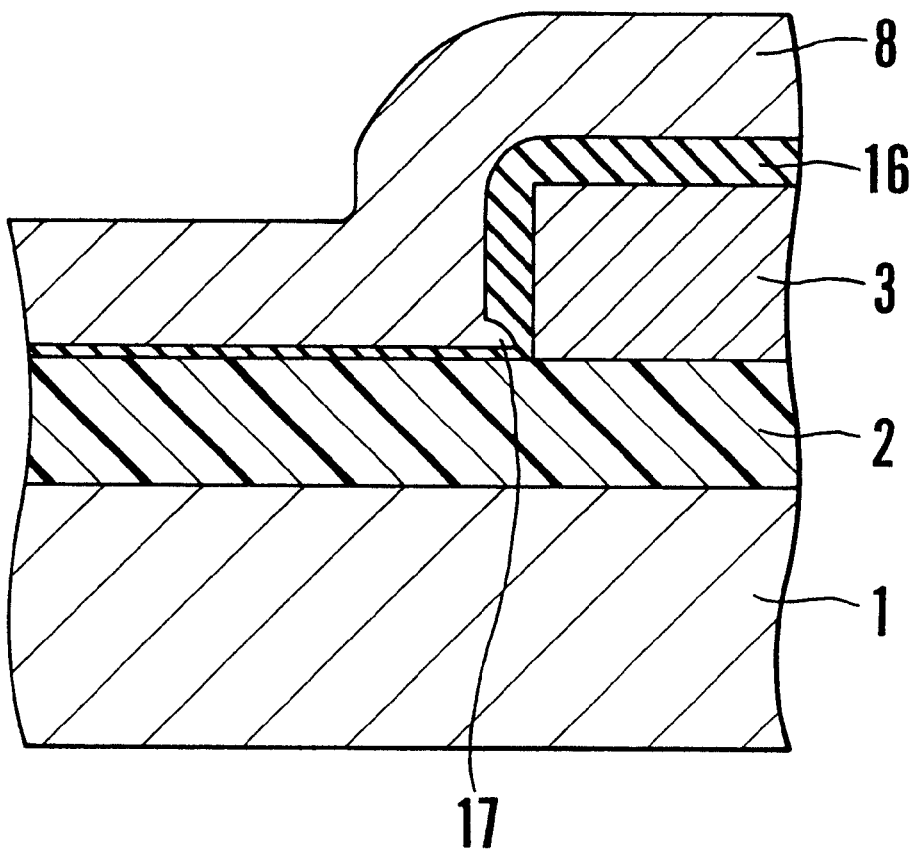
FIG. 4 is a graph showing the problem of the prior art.

When the amorphous silicon film 4 is converted into the silicon nitride film 5, and the silicon nitride film 6 is formed on the silicon nitride film 5 by LP-CVD, no difference in growth thickness is generated between the films on the silicon nitride film and on the silicon oxide film, unlike the prior art. The silicon nitride films 6 having the same thickness can be grown on the lower electrode 3 consisting of the polysilicon film and on the silicon oxide film 2 serving as an interlayer. Therefore, the disadvantage of the prior art which has been described with reference to FIG. 4 can be avoided.

Figure 6:
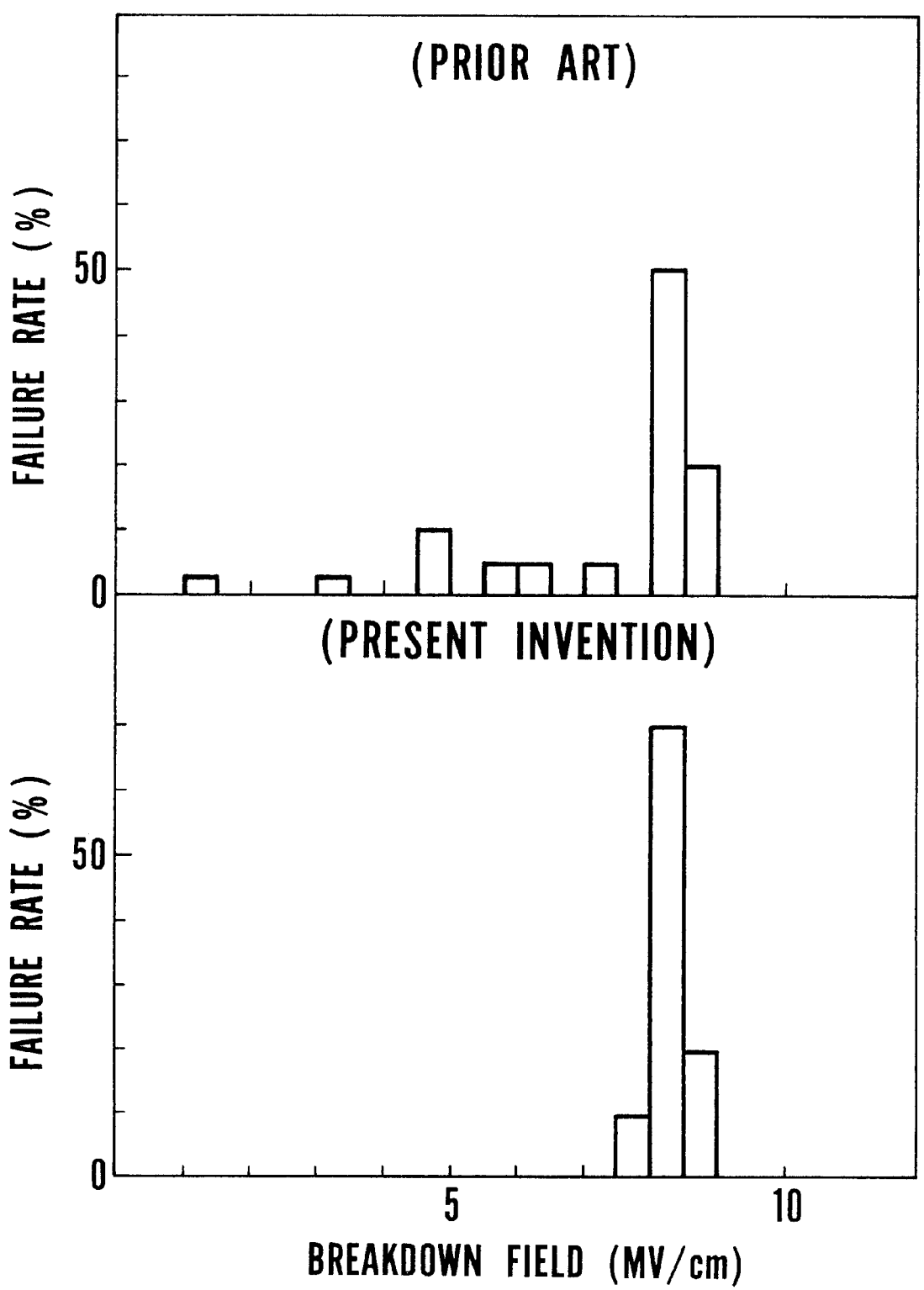
FIG. 6 is a graph showing the breakdown voltage distribution of a semiconductor device obtained by the first embodiment of the present invention, compared to that of a semiconductor device obtained by the prior art.

FIG. 6 is a graph showing the breakdown voltage distribution of a capacitive insulating film having a thickness of 4 nm as a thickness converted into a silicon oxide film of the present invention and the prior art 1 reference.

By using the manufacturing method according to the first embodiment of the present invention, conventional breakdown in low and intermediate electric fields does not occur, so that a satisfactory breakdown voltage distribution can be obtained. As a result, the silicon nitride film 6 can be made as thin as 5 nm, or 4 nm as a thickness converted into a silicon oxide film.

Even in comparison with the prior art 2 reference, the capacitive insulating film of the present invention has a high quality because the silicon nitride film is formed by LP-CVD. Therefore, a film having a satisfactory breakdown voltage distribution and leakage current characteristic can be obtained.

In the present invention, the amorphous silicon film is formed to prevent the delay in growth of the silicon nitride film 6, and a thin amorphous silicon film suffices. The amorphous silicon film is sufficiently converted into the silicon nitride film in the subsequent thermal nitriding process. Since a perfect insulating film is obtained, no short circuit occurs between the upper and lower electrodes.

Figure 7:
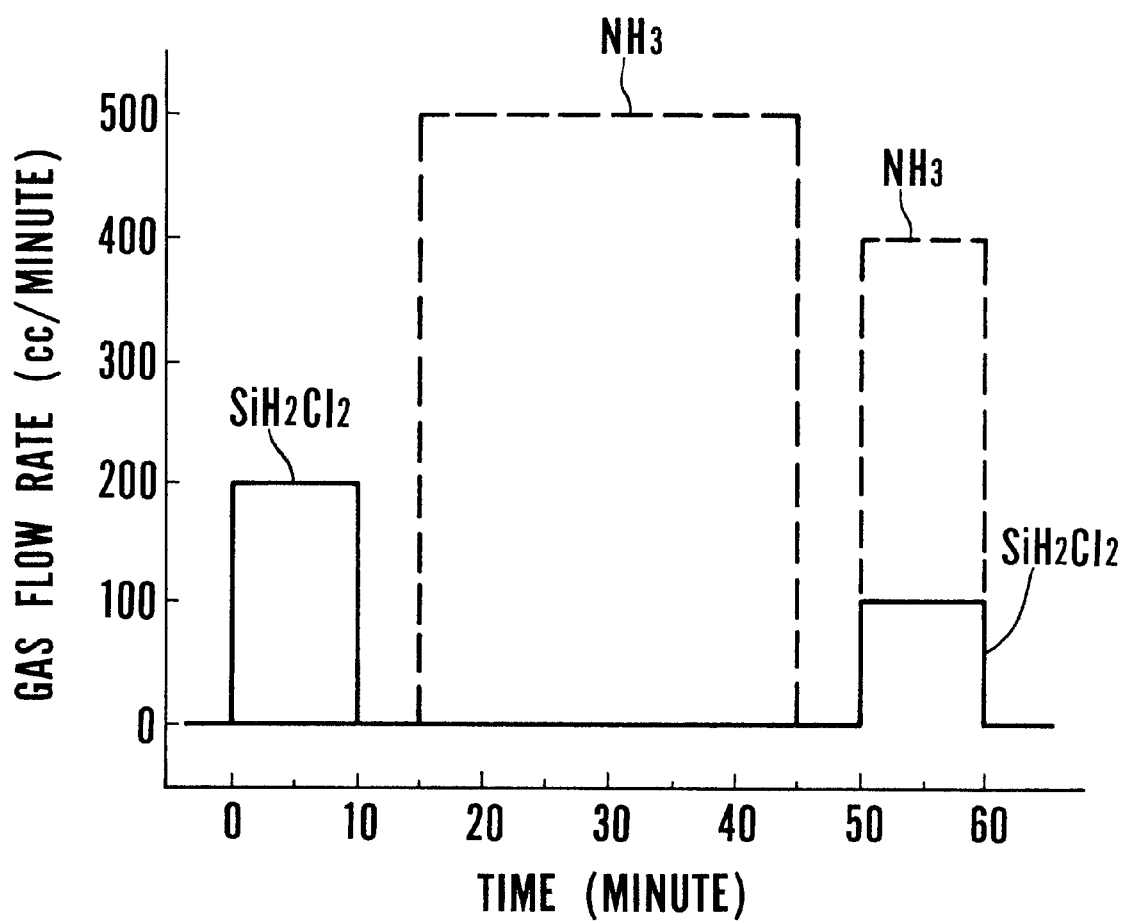
FIG. 7 is a graph schematically showing the gas sequence of a manufacturing method according to the second embodiment of the present invention.

The second embodiment of the present invention will be described below with reference to FIG. 7. FIG. 7 shows the gas sequence performed when the processes of the present invention, i.e., processes from amorphous silicon film formation to silicon nitride film formation by LP-CVD are performed by one apparatus.

In the second embodiment, a conventional vertical LP-CVD apparatus can be used. The remaining processes are the same as those in the first embodiment.

In the first step (0 to 10 minutes of the abscissa), $SiH_2Cl_2$ gas is supplied at about 200 sccm for about ten minutes to form an amorphous silicon film having a thickness of 0.5 to 2 nm. At this time, the amorphous silicon film is formed on the surface of a polysilicon film as a lower electrode and on the surface of a silicon oxide film as an insulating interlayer. Even when the amorphous silicon film on the surface of the silicon oxide film is thinner than that on the surface of the polysilicon film, no problem is posed in the present invention.

In the second step (15 to 45 minutes of the abscissa), supply of the $SiH_2Cl_2$ gas is stopped. $NH_3$ gas is allowed to flow at about 500 sccm for about 30 minutes to nitride the amorphous silicon film into a silicon nitride film.

Supply of the $NH_3$ gas is stopped, and the chamber is temporarily evacuated. In the third step (50 to 60 minutes of the abscissa), $SiH_2Cl_2$ gas and $NH_3$ gas are allowed to flow at about 100 sccm and about 400 sccm, respectively, for about ten minutes to form a silicon nitride film having a thickness of about 5 nm by CVD. At this time, the temperature may be 500° C. to 700° C., and the pressure may be 0.2 to 1 Torr.

As described above, when amorphous silicon film formation, nitriding, and silicon nitride film growth are performed by one apparatus without exposing the wafer to the outer atmosphere, the processes can be stably executed without being affected by adsorption in the outer atmosphere.

Particularly, when the wafer is exposed to the outer atmosphere between amorphous silicon film formation and nitriding, the degree of nitriding varies due to applied water or the like.

In addition, when the wafer is exposed to the outer atmosphere before silicon nitride film formation by CVD, the growth of the silicon nitride film is delayed because of the adsorbed moisture or the like.

In the second embodiment, the manufacturing process is performed in a chamber of one apparatus. However, amorphous silicon film formation, nitriding, and silicon nitride film growth may be performed in different chambers, and the wafer may be conveyed between the chambers in a vacuum or nitrogen atmosphere.

Figure 8:
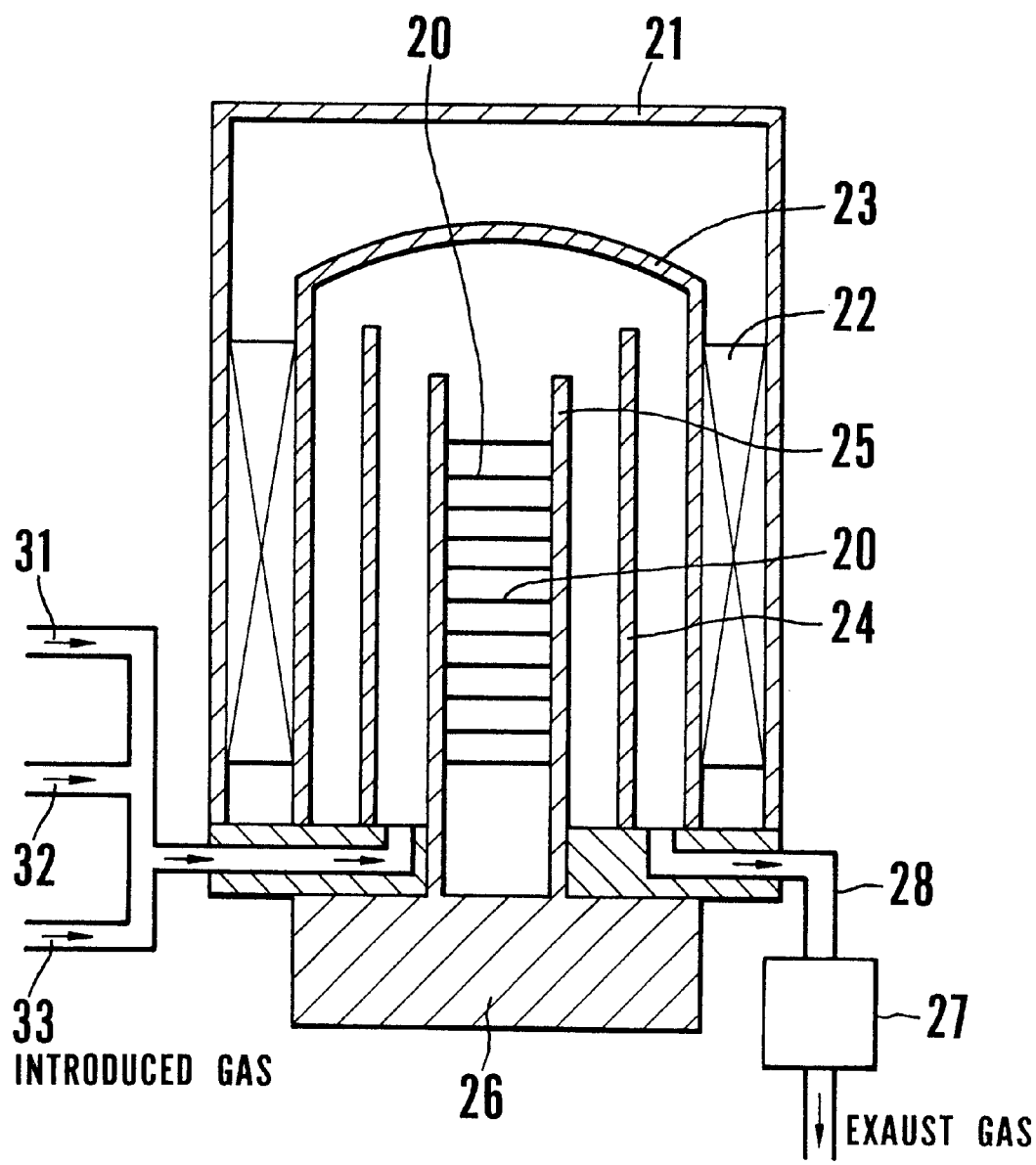
FIG. 8 is a sectional view showing the schematic arrangement of a vertical LP-CVD apparatus as an example of a manufacturing apparatus usable for the manufacturing method of the present invention.
Figure 9:
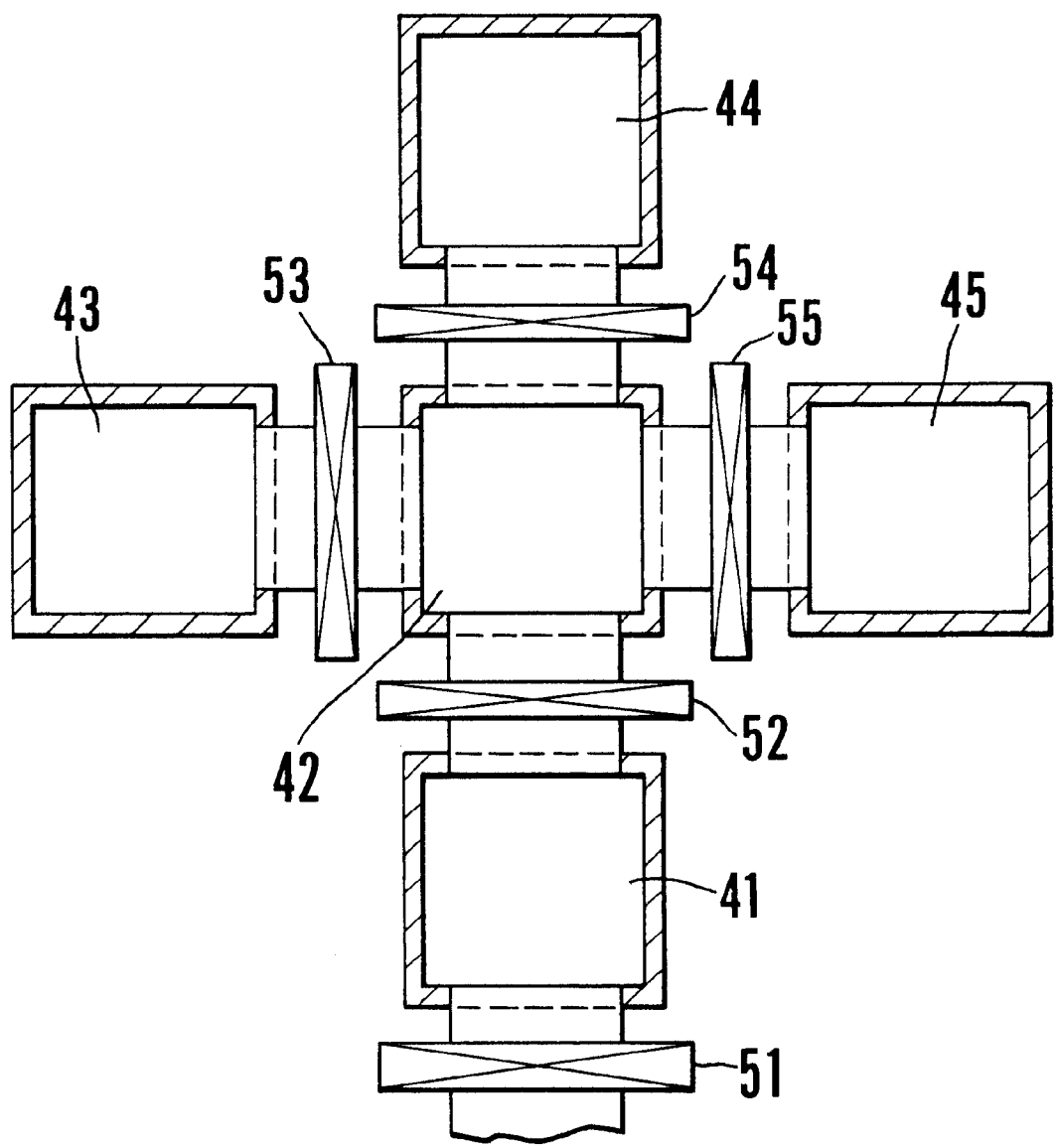
FIG. 9 is a sectional view showing the schematic arrangement of a multichamber apparatus of a single wafers processing type as another example of the manufacturing apparatus usable for the manufacturing method of the present invention.

Manufacturing in a chamber can be performed by, e.g., a vertical LP-CVD apparatus as shown in FIG. 8, and manufacturing in different chambers can be performed by, e.g., a multichamber apparatus of a single wafer processing type as shown in FIG. 9.

Referring to FIG. 8, a heater 22 is mounted between a furnace 21 and an outer tube 23. The outer tube 23 is evacuated to a predetermined degree of vacuum by a pump 27 through an exhaust pipe 28. A number of semiconductor wafers 20 arranged at a predetermined interval are horizontally held in a boat 25 on a boat elevator 26. The semiconductor wafers are mounted in an inner tube 24 in the outer tube 23.

$SiH_2Cl_2$ gas can be introduced from a first gas introduction port 31 through a valve (not shown). $NH_3$ gas can be introduced from a second gas introduction port 32 through a valve (not shown). $N_2$ gas can be introduced from a third gas introduction port 33 through a valve (not shown).

When the embodiment of the present invention is to be applied to the semiconductor wafer 20 by using this batch type vertical LP-CVD apparatus, only the $SiH_2Cl_2$ gas is supplied first to form a silicon film. Thereafter, annealing is performed in an $NH_3$ gas or $N_2$ gas atmosphere to thermally nitride the silicon film. The temperature is lowered, and the $SiH_2Cl_2$ gas and $NH_3$ gas are supplied to form a silicon nitride film.

The semiconductor wafer is kept mounted in the boat 25 in the inner tube 24 during the series of processes and never exposed to the outer atmosphere. Instead of the $SiH_2Cl_2$ gas, $SiH_4$ gas may be supplied from the first gas introduction port 31.

Referring to FIG. 9, a semiconductor wafer which is conveyed into an interlock chamber 41 through a valve 51 is fed into a transfer chamber 42 through a valve 52 and then fed into a silicon film growth chamber 43 through a valve 53 to form a silicon film. The semiconductor wafer returns to the transfer chamber 42 through the valve 53 and is fed into a nitridation chamber 44 through a valve 54 to nitride the silicon film. The semiconductor wafer returns to the transfer chamber 42 through the valve 54 and is fed into a silicon nitride film growth chamber 45 through a valve 55 to form a silicon nitride film by CVD. The semiconductor wafer returns to the transfer chamber 42 through the valve 55, returns to the interlock chamber 41 through the valve 52, and then is unloaded from the interlock chamber 41 through the valve 51.

In this multichamber apparatus of a single wafer processing type, silicon film formation, silicon film nitriding, and silicon nitride film formation by CVD are performed in the independent chambers 43, 44, and 45, respectively. Conveyance of the semiconductor wafer among chambers including the interlock chamber 41 and the transfer chamber 42 is performed in an $N_2$ or vacuum atmosphere. The semiconductor wafer is never exposed to the outer atmosphere until the series of processes, i.e., silicon film formation, silicon film nitriding, and silicon nitride film formation are completed.

In the first and second embodiments, the temperature and pressure can be freely changed in amorphous silicon film formation, nitriding, and silicon nitride film formation. Particularly, in nitriding, it easily progresses at a high temperature and at a high pressure of several to several tens Torr. Therefore, the conditions may be set, as needed.

In the first and second embodiments, an amorphous silicon film is formed. However, instead of the amorphous silicon film, a polysilicon film or a film consisting of a mixture of amorphous silicon and polysilicon may be formed. The crystalline state of the silicon film can be selected depending on the apparatus to be used.

In the first and second embodiments, $SiH_2Cl_2$ gas is used. However, instead of the $SiH_2Cl_2$ gas, $SiH_4$ gas or $Si_2H_6$ gas can be used. In addition, the gases used in silicon film formation process and silicon nitride film growth can be replaced with $SiH_4$ gas and $SiH_2Cl_2$ gas, respectively.

In the above description, a silicon film such as an amorphous silicon film is formed. However, instead of forming a silicon film, a gas such as $SiH_2Cl_2$ gas may be adsorbed on the surface of the polysilicon film as a lower electrode and the surface of the silicon oxide film as an insulating interlayer, i.e., moisture or the like may be adsorbed in the surfaces, and nitriding may be performed in this state. This process can be performed at a temperature lower than that in formation of a silicon film such as an amorphous silicon film.

As to conditions in this process, for example, a temperature may be at 400° C. to 450° C. and the pressure may be 0.2 to 1 Torr. A gas containing silicon may be adsorbed on the surface of the polysilicon film 3 used as a lower electrode and the surface of the silicon oxide film 2 used as an insulating interlayer by allowing $SiH_2Cl_2$ gas or $SiH_4$ gas to flow at about 100 to 300 sccm. After that, as is similar to the first and the second embodiments, a silicon nitride film 5 is formed by applying annealing to the silicon gas adsorbed polysilicon and silicon oxide films 3 and 2 at 700° C. to 900° C. under the atmosphere of an $NH_3$ gas or $N_2$ gas.

As this time, nitriding and the formation of silicon film from the gas containing silicon adsorbed on the surface of the polysilicon film 3 and the silicon oxide film 2 are simultaneously progressed with each other because of a high temperature. Subsequently, a silicon nitride film is formed on the polysilicon and silicon oxide films 3 and 2, and thereafter the silicon nitride film is allowed to grow by LP-CVD as is similar to the first and the second embodiments.

More specifically, the amorphous silicon film 4 shown in FIG. 5B becomes gas molecules containing silicon, and the silicon nitride film 5 shown in FIG. 5C is formed by nitriding the gas molecules containing silicon. The gas molecules containing silicon consist of silicon and hydrogen or chlorine, and therefore it can be considered that hydrogen or the like is separated by nitridation.

In this case as well, the process of applying gas molecules containing silicon, the process of nitriding the applied gas molecules, and the process of forming a silicon nitride film by CVD are preferably performed using one manufacturing apparatus, i.e., the manufacturing apparatus shown in FIG. 8 or 9 without exposing the semiconductor wafer to the outer atmosphere.

What is claimed is:

1. A method of manufacturing a semiconductor device having a capacitor portion consisting of a lower electrode, an upper electrode, and a dielectric film therebetween on a semiconductor substrate, said method comprising the steps of:
   (a) forming a silicon film on a surface of said lower electrode and a surface of an insulating film adjacent to said lower electrode;
   (b) performing annealing in an atmosphere containing nitrogen or ammonia to nitride said silicon film thereby forming a first silicon nitride film on the surface of said lower electrode and on the surface of said insulating film adjacent to said lower electrode; and
   (c) forming a second silicon nitride film on an entire surface of said first silicon nitride film formed in step (b), by LP-CVD.

2. A method according to claim 1, wherein the step of forming said silicon film, the step of annealing said silicon film, and the step of forming said second silicon nitride film by LP-CVD are performed in one manufacturing apparatus without exposing a wafer to an atmosphere.

3. A method according to claim 2, wherein said manufacturing apparatus is a vertical low-pressure chemical vapor deposition apparatus.

4. A method according to claim 2, wherein said manufacturing apparatus is a multichamber apparatus of a single wafer processing type.

5. A method according to claim 1, wherein said silicon film is formed using one of silane gas, disilane gas, and dichlorosilane gas.

6. A method of manufacturing a semiconductor device having a capacitor portion consisting of a lower electrode, an upper electrode, and a dielectric film therebetween on a semiconductor substrate, said method comprising the steps of:
   (a) adsorbing gas molecules containing silicon in a surface of said lower electrode and a surface of an insulating film adjacent to said lower electrode;
   (b) performing annealing in an atmosphere containing nitrogen or ammonia to nitride the adsorbed gas molecules containing silicon thereby forming a first silicon nitride film on the surface of said lower electrode and on the surface of the insulating film adjacent to said lower electrode; and
   (c) forming a second silicon nitride film on an entire surface of said first silicon nitride film formed in step (b), by LP-CVD.

7. A method according to claim 6, wherein the step of adsorbing the gas molecules containing silicon, the step of annealing, and the step of forming said second silicon nitride film by LP-CVD are performed in one manufacturing apparatus without exposing a wafer to an outer atmosphere.

8. A method according to claim 7, wherein said manufacturing apparatus is a vertical low-pressure chemical vapor deposition apparatus.

9. A method according to claim 7, wherein said manufacturing apparatus is a multichamber apparatus of a single wafer processing type.

10. A method according to claim 6, wherein said silicon film is formed using one of silane gas, disilane gas, and dichlorosilane gas.

11. In a semiconductor device having a capacitor portion formed on top of an insulating layer that is above a semiconductor substrate, the capacitor portion consisting of a lower electrode formed on top of the insulating layer, a dielectric layer formed on top of the lower electrode and on top of the insulating layer adjacent to the lower electrode, and an upper electrode formed on top of the dielectric layer, a method of forming the dielectric layer to a first thickness on top of the lower electrode and to a second thickness, equal to the first thickness, on top of the insulating layer adjacent to the lower electrode to suppress leakage currents between the lower and upper electrodes, said method being performed after forming the lower electrode on top of the insulating layer and comprising the steps of:
   (a) forming a silicon film on a surface of the lower electrode and a surface of the insulating layer adjacent to the lower electrode;
   (b) performing annealing in an atmosphere containing nitrogen or ammonia to nitride the silicon film thereby forming a first silicon nitride film on the surface of the lower electrode and on the surface of the insulating layer adjacent to the lower electrode; and
   (c) forming a second silicon nitride film on an entire surface of the first silicon nitride film formed in step (b), by LP-CVD.

12. A method according to claim 11, wherein the step of forming said silicon film, the step of annealing said silicon film, and the step of forming said second silicon nitride film by LP-CVD are performed in one manufacturing apparatus without exposing a wafer to an atmosphere.

13. A method according to claim 12, wherein said manufacturing apparatus is a vertical low-pressure chemical vapor deposition apparatus.

14. A method according to claim 12, wherein said manufacturing apparatus is a multichamber apparatus of a single wafer processing type.

15. A method according to claim 11, wherein said silicon film is formed using one of silane gas, disilane gas, and dichlorosilane gas.

* * * * *